United States Patent
Lu et al.

(10) Patent No.: US 8,983,251 B2
(45) Date of Patent: Mar. 17, 2015

(54) ELECTRO-OPTICAL WAVEGUIDE APPARATUSES AND METHODS THEREOF

(71) Applicant: Rochester Institute of Technology, Rochester, NY (US)

(72) Inventors: Zhaolin Lu, Pittsford, NY (US); Wangshi Zhao, Rochester, NY (US)

(73) Assignee: Rochester Institute of Technology, Rochester, NY (US)

( * ) Notice: Subject to any disclaimer, the term of this patent is extended or adjusted under 35 U.S.C. 154(b) by 219 days.

(21) Appl. No.: 13/710,093

(22) Filed: Dec. 10, 2012

(65) Prior Publication Data

US 2014/0023321 A1    Jan. 23, 2014

Related U.S. Application Data

(60) Provisional application No. 61/569,059, filed on Dec. 9, 2011, provisional application No. 61/640,519, filed on Apr. 30, 2012.

(51) Int. Cl.

| | |
|---|---|
| *G02B 6/26* | (2006.01) |
| *G02B 6/10* | (2006.01) |
| *H01L 31/18* | (2006.01) |
| *B82Y 10/00* | (2011.01) |
| *B82Y 30/00* | (2011.01) |
| *G02F 1/015* | (2006.01) |
| *G02B 6/42* | (2006.01) |
| *H01L 29/16* | (2006.01) |
| *G02B 6/122* | (2006.01) |

(52) U.S. Cl.
CPC ............ *G02B 6/10* (2013.01); *H01L 31/18* (2013.01); *B82Y 10/00* (2013.01); *B82Y 30/00* (2013.01); *G02F 1/015* (2013.01); *H01L 29/1606* (2013.01); *G02F 2001/0153* (2013.01); *G02F 2203/10* (2013.01); *G02B 6/1226* (2013.01)
USPC ............................................ 385/40

(58) Field of Classification Search
USPC ............................................ 385/40
See application file for complete search history.

(56) References Cited

U.S. PATENT DOCUMENTS

| | | | | |
|---|---|---|---|---|
| 8,755,662 B2 * | 6/2014 | Kim | .............. | 385/131 |
| 2014/0023321 A1 * | 1/2014 | Lu et al. | .......... | 385/40 |

OTHER PUBLICATIONS

F. Wang et al., "Gate-Variable Optical Transitions in Graphene," Science, vol. 320, pp. 206-209, Apr. 11, 2008.

(Continued)

*Primary Examiner* — Rhonda Peace
(74) *Attorney, Agent, or Firm* — Joseph M. Noto; Bond Schoeneck & King PLLC

(57) ABSTRACT

An apparatus with either a graphene sheet or an epsilon-near-zero layer sandwiched in a waveguide structure and a tuning device. The tuning device is configured to selectively control application of at least first and second gate voltages across the waveguide structure. The graphene sheet has a first dielectric constant which is zero and the waveguide structure operates at a first absorption state and a first propagation distance with application of the first voltage by the tuning device and has a second dielectric constant and the waveguide structure operates at a second absorption state and a second propagation distance with application of the second voltage. The second dielectric constant is larger than the first dielectric constant, the second absorption state is smaller than the first absorption state, the second propagation distance is longer than the first propagation distance, and the second voltage which is zero or smaller than the first voltage.

30 Claims, 14 Drawing Sheets

(56) References Cited

OTHER PUBLICATIONS

B. G. Lee et al., "High-Performance Modulators and Switches for Silicon Photonic Networks-on-Chip," IEEE Journal of Selected Topics in Quantum Electronics, vol. 16, No. 1, pp. 6-22, Jan./Feb. 2010.

H-W Chen et al., "25 Gb/s hybrid silicon switch using a capacitively loaded traveling wave electrode," Optics Express, vol. 18, No. 2, pp. 1070-1075, Jan. 18, 2010.

Q. Xu et al., "12.5 Gbit/s carrier-injection-based silicon micro-ring silicon modulators," Optics Express, vol. 15, No. 2, pp. 430-436, Jan. 27, 2007.

L. Alloatti et al., "42.7 Gbit/s electro-optic modulator in silicon technology," Optics Express, vol. 19, No. 12, pp. 11841-11851, Jun. 6, 2011.

A. Liu et al., "A high-speed silicon optical modulator based on a metal-oxide-semiconductor capacitor," Nature, vol. 427, pp. 615-618, Feb. 12, 2004.

A. B. Kuzmenko et al., "Universal Optical Conductance of Graphite," The American Physical Society, PRL 100, pp. 117401-1-117401-4, Mar. 2008.

V. P. Gusynin et al., "Magneto-optical conductivity in Graphene," Journal of Physics, pp. 1-28, May 25, 2007.

S. A. Maier et al., "Plasmonics: Localization and guiding of electromagnetic energy in metal/dielectric structures," Journal of Applied Physics, vol. 98, pp. 011101-1-011101-10, 2005.

Q. Xu et al., "Micrometre-scale silicon electro-optic modulator," Nature, vol. 4435, pp. 325-327, May 19, 2005.

Z. Lu et al., "Nanoscale Graphene Electro-Optic Modulators," Rochester Institute of Technology, Dec. 2011.

E. Ozbay, "Plasmonics: Merging Photonic and Electronics at Nanoscale Dimensions," Science, vol. 311, pp. 189-193, Jan. 13, 2006.

Q. Xu et al., "Experimental demonstration of guiding and confining light in nanometer-size low-refractive-index material," Optics Letters, vol. 29, No. 14, pp. 1626-1628, Jul. 15, 2004.

V. R. Almeida et al., "Guiding and confining light in void nanostructure," Optics Letter, vol. 29, No. 11, pp. 1209-1211, Jun. 1, 2004.

M. Liu et al., "A graphene-based broadband optical modulator," Nature, vol. 474, pp. 64-67, Jun. 2, 2011.

D. R. Anderson, "Graphene-based long-wave infrared TM surface plasmon modulator," J. Optical Society of America B, vol. 27, No. 4, pp. 818-823, Apr. 2010.

\* cited by examiner

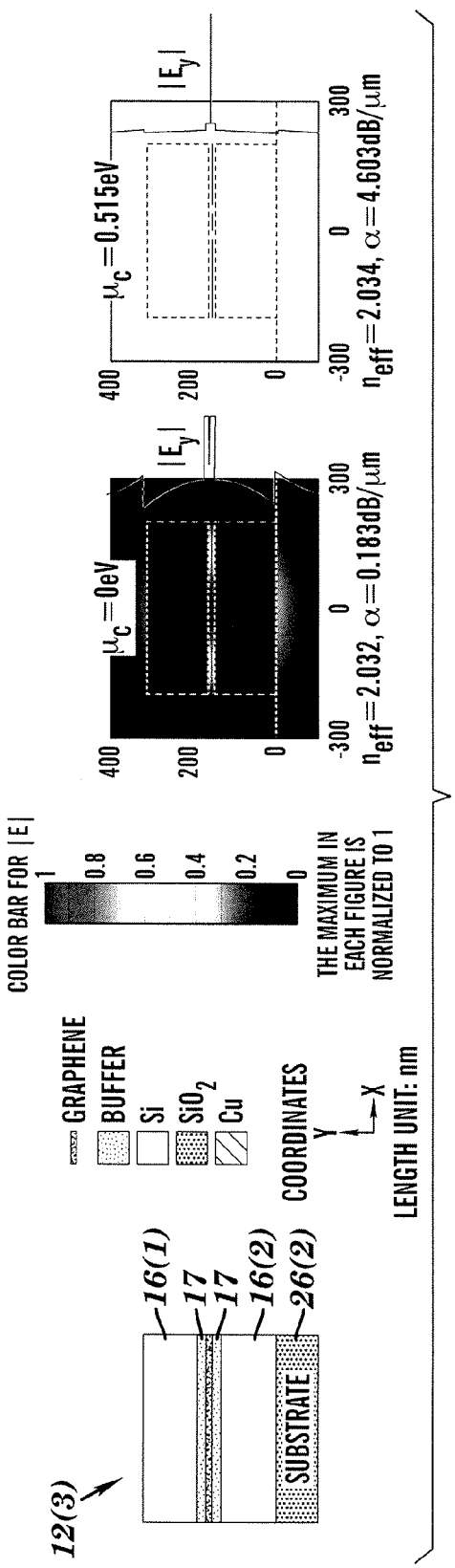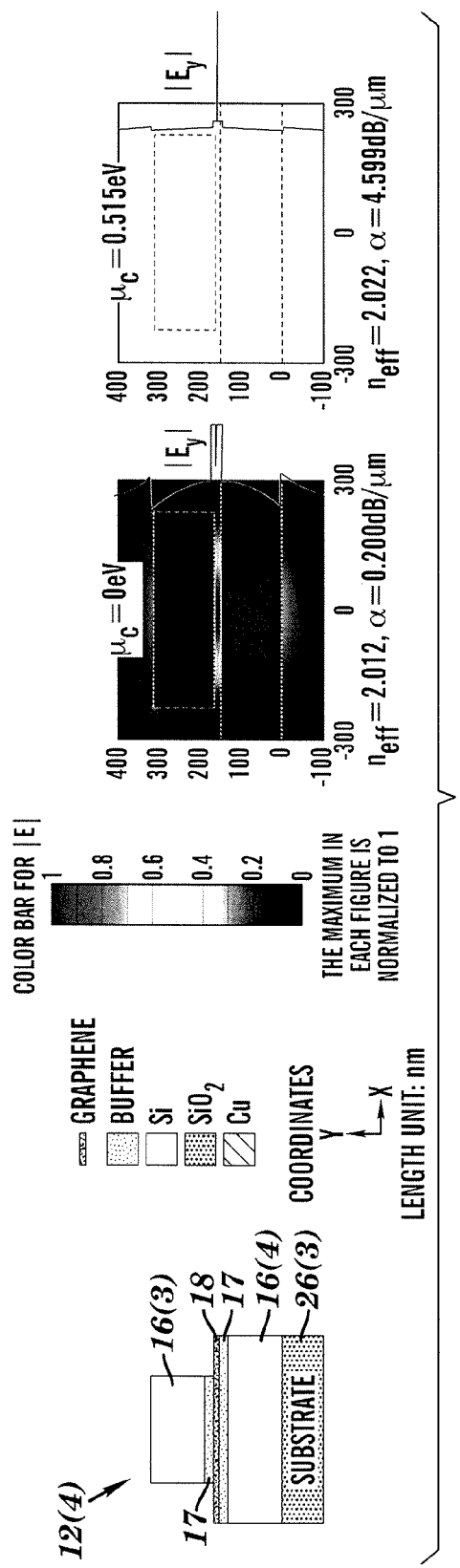
FIG. 5A
FIG. 5B

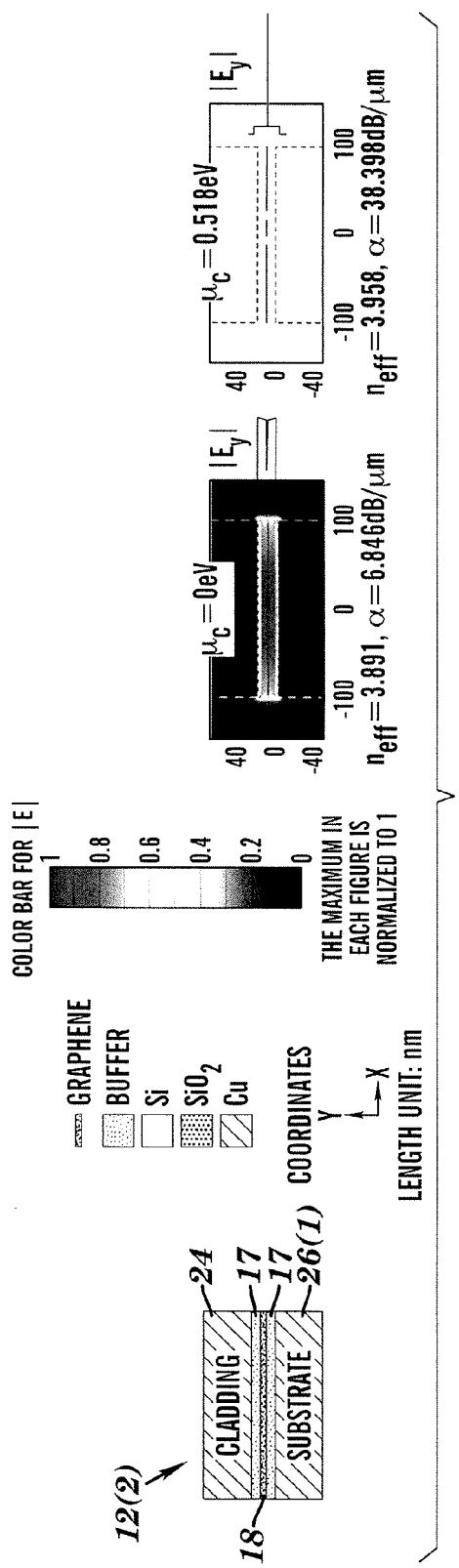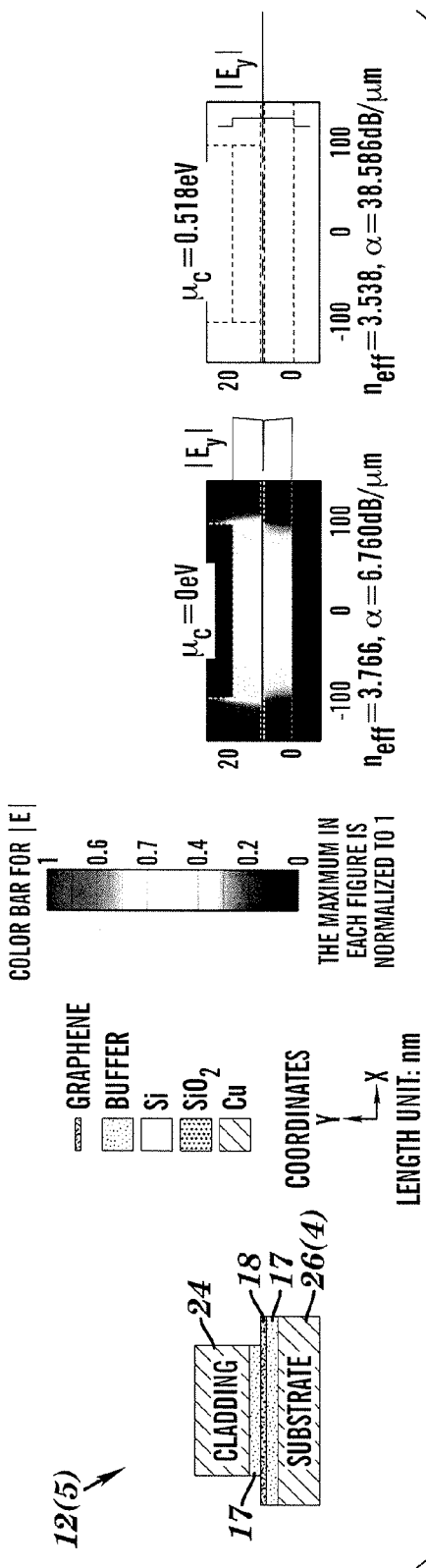
FIG. 5C
FIG. 5D

ELECTRO-OPTICAL WAVEGUIDE APPARATUSES AND METHODS THEREOF

This application claims the benefit of U.S. Provisional Patent Application Ser. No. 61/569,059, filed Dec. 9, 2011, and of U.S. Provisional Patent Application Ser. No. 61/640,519, filed Apr. 30, 2012, which are each hereby incorporated by reference in their entirety.

This invention was made with government support under grant number ECCS-1057381 awarded by National Science Foundation and grant number W911NF-10-1-0153 awarded by U.S. Army. The government has certain rights in this invention.

FIELD

This technology generally relates to electro-optic (EO) modulators and, more particularly, to electro-optical waveguide apparatuses with tunable waveguides, including tunable graphene slot waveguides and epsilon near zero waveguides, and methods thereof.

BACKGROUND

One of the most important devices in optoelectronic integrated circuits is the electro-optic (EO) modulator which converts electronic signals into high bit-rate photonic data. Recent years have witnessed breakthroughs in the development of EO modulators.

Unfortunately, the lack of ultrahigh-speed compact EO modulators remains a critical technical bottleneck impeding the wide deployment of the on-chip optical interconnects. Conventional EO modulators have a very large footprint because of the poor electro-optic properties of the current materials used in their manufacture. The use of a high-Q resonator in these modulators might significantly reduce their footprint, but would simultaneously decrease the operation bandwidth and thermal stability which then would require additional components to improve bandwidth and stability. Hybrid semiconductors may partially resolve these issues, but the resulting waveguides in these modulators are still tens to hundreds of micrometers long.

One prior slot waveguide for enhancing and confining light in a nanometer-wide low-index material is illustrated in FIG. 1 and was disclosed in V. R. Almeida, Q. Xu, C. A. Barrios, and M. Lipson, "Guiding and confining light in void nanostructure," Opt. Lett. 29, 1209 (2004) and in Q. Xu, V. R. Almeida, and M. Lipson, "Experimental demonstration of guiding and confining light in nanometer-size low-refractive-index material," Opt. Lett. 29, 1626 (2004) which are each hereby incorporated by reference in their entirety. With this waveguide, light enhancement and confinement is caused by large discontinuity of the electric field at high-index-contrast interfaces.

A prior graphene-based surface plasmon modulator is illustrated in FIG. 2 and is disclosed in D. R. Andersen, "Graphene-based long-wave infrared TM surface plasmon modulator," J. Opt. Soc. Am. B 27, 818-823 (2010) which is hereby incorporated by reference in its entirety. This modulator is proposed for long-wave infrared applications based on electrically switching on/off the surface plasmons on graphene. With this modulator the plasmon losses vary as a function of carrier density, which can be varied by the carrier density with an applied gate bias voltage.

Another prior graphene optical modulator is illustrated in FIG. 3 and is disclosed in M. Liu, X. Yin, E. Ulin-Avila, B. Geng, T. Zentgraf, L. Ju, F.g Wang, and X. Zhang, "A graphene-based broadband optical modulator," Nature 474, 64 (2011) which is hereby incorporated by reference in its entirety. This broadband EO modulator is based on the interband absorption of graphene. However, compared with the size of on-chip electronic components it is still bulky and more suitable for chip-to-chip optical interconnects. On-chip optical interconnects require EO modulators at the nanoscale. Shrinking the dimensions of existing graphene modulators will result in a very poor modulation depth.

SUMMARY

An electro-optical waveguide apparatus includes a graphene sheet having opposing surfaces sandwiched in a waveguide structure, and a tuning device. The tuning device is configured to selectively control application of at least first and second gate voltages across the waveguide structure. The graphene sheet has a first dielectric constant which is zero and the waveguide structure operates at a first absorption state and a first propagation distance with application of the first gate voltage by the tuning device. The graphene sheet has a second dielectric constant and the waveguide structure operates at a second absorption state and a second propagation distance with application of the second gate voltage by the tuning device. The second dielectric constant is larger than the first dielectric constant, the second absorption state is smaller than the first absorption state, the second propagation distance is longer than the first propagation distance, and the second gate voltage which is zero or smaller than the first gate voltage.

A method for making an electro-optical apparatus includes providing a graphene sheet having opposing surfaces sandwiched in a waveguide structure. A tuning device is configured to selectively control application of at least first and second gate voltages across the waveguide structure. The graphene sheet has a first dielectric constant which is zero and the waveguide structure operates at a first absorption state and a first propagation distance with application of the first gate voltage by the tuning device. The graphene sheet has a second dielectric constant and the waveguide structure operates at a second absorption state and a second propagation distance with application of the second gate voltage by the tuning device. The second dielectric constant is larger than the first dielectric constant, the second absorption state is smaller than the first absorption state, the second propagation distance is longer than the first propagation distance, and the second gate voltage which is zero or smaller than the first gate voltage.

An electro-optical waveguide apparatus includes an epsilon-near-zero layer having an opposing surfaces sandwiched in a waveguide structure and a tuning device. The tuning device is configured to selectively control application of at least first and second gate voltages across the waveguide structure. The epsilon-near-zero layer has a first dielectric constant which is zero and the waveguide structure operates at a first absorption state and a first propagation distance with application of the first gate voltage by the tuning device. The epsilon-near-zero layer has a second dielectric constant and the waveguide structure operates at a second absorption state and a second propagation distance with application of the second gate voltage by the tuning device. The second dielectric constant is larger than the first dielectric constant, the second absorption state is smaller than the first absorption state, the second propagation distance is longer than the first propagation distance, and the second gate voltage is zero or smaller than the first gate voltage.

A method for making an electro-optical apparatus includes providing an epsilon-near-zero layer having opposing surfaces sandwiched in a waveguide structure. A tuning device is configured to selectively control application of at least first and second gate voltages across the waveguide structure. The epsilon-near-zero layer has a first dielectric constant which is zero and the waveguide structure operates at a first absorption state and a first propagation distance with application of the first gate voltage by the tuning device. The epsilon-near-zero layer has a second dielectric constant and the waveguide structure operates at a second absorption state and a second propagation distance with application of the second gate voltage. The second dielectric constant is larger than the first dielectric constant, the second absorption state is smaller than the first absorption state, the second propagation distance is longer than the first propagation distance, and the second gate voltage is zero or smaller than the first gate voltage.

This technology provides a number of advantages including providing more compact and effective electro-optical waveguide apparatuses with tunable waveguides, including tunable graphene slot waveguides and epsilon near zero waveguides, and methods thereof. This technology provides electro-optical waveguide apparatuses with nanoscale footprints, small insertion loss, broadband capability, ultrahigh speed, low power consumption, thermal stability, potential ultrahigh-speed, and being CMOS-compatible. Additionally, this technology is not only effective for EO modulation, but also can be used in number of other applications, such as all-optic modulation and optical detection by way of example. Further, this technology remove the technical bottleneck in on-chip optical interconnects which currently exists.

DETAILED DESCRIPTION

Figure 4A:
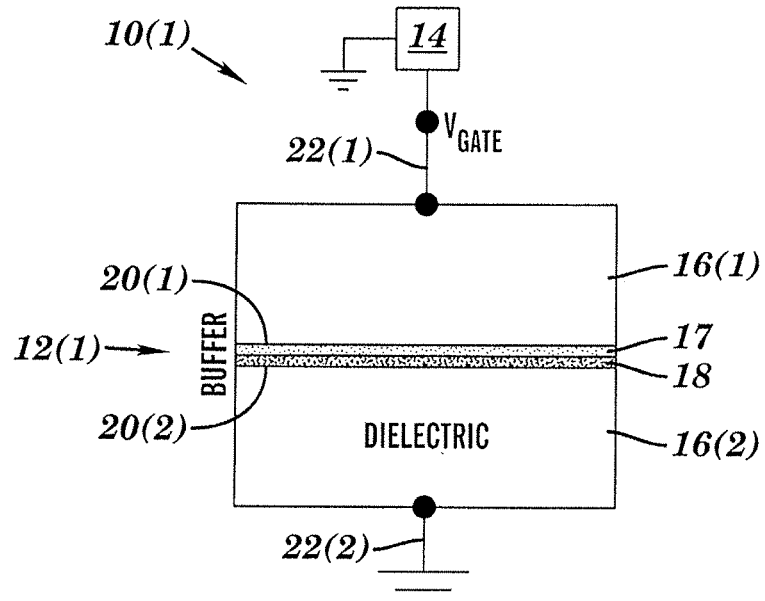
FIG. 4(a) is a side view a graphene-slot plasmonic waveguide.

An exemplary electro-optical waveguide apparatus 10(1) is illustrated in FIG. 4(a). The electro-optical waveguide apparatus 10(1) includes a graphene-slot plasmonic waveguide 12(1) and a tuning device 14, although other types of electro-optical waveguide apparatuses with other types and numbers of components or other elements in other configurations could be used. This technology provides a number of advantages including providing more compact and effective electro-optical waveguide apparatuses with tunable waveguides, including tunable graphene slot waveguides and epsilon near zero waveguides, and methods thereof.

Referring more specifically to FIG. 4(a), the graphene-slot plasmonic waveguide 12(1) includes dielectric layers 16(1) and 16(2) made of silicon, buffer layers 17 made of $Si_3N_4$, a graphene sheet 18, and control electrodes 22(1) and 22(2), although other types of waveguides, other types and numbers of layers, elements or other components, made of other materials, and in other configurations could be used. In this example, the graphene sheet 18 is a mono-atomic layer graphene sheet, although other types of graphene sheets can be used, such as a multi-atomic layer graphene sheet. Graphene has a number of unique optical properties, including strong coupling with light, high-speed operation, and gate-variable optical conductivity. With respect to EO modulators, graphene is a single atom thick "film" with optical properties that are slightly dispersive and can be tuned in a large range at an ultrahigh speed through electrical gating-nearly an ideal electro-optic material.

The dielectric layer 16(1) is located on a buffer layer 17 which is over surface 20(1) of the graphene sheet 18 and the dielectric layer 16(2) is located on another buffer layer 17 which is over surface 20(2) of the graphene sheet 18, although there may be other numbers and types of layers on one side or both sides of the graphene sheet 18. In this example, the dielectric layers 16(1) and 16(2) each have substantially the same width and the buffer layers 17 each have substantially the same width, although other dimensions for each could be used. One of the control electrodes 22(1) is coupled to the dielectric layer 16(1) and the other control electrode 22(2) is coupled to the other dielectric layer 16(2), although other types, numbers and manners of electrical connections could be used.

The tuning device 14 is coupled across the control electrodes 22(1) and 22(2), although other types and numbers of control apparatuses could be used. The tuning device 14 is configured to provide a gate voltage. The tuning device 14 includes a voltage source coupled to a control switch which regulates voltage output from the voltage source across control electrodes 22(1) and 22(2), although the tuning device 14 could include other types of systems, devices, components or other elements in other configurations, such as a processor and memory with programmed control instructions on when and how to control the control switch to apply a gate voltage by way of example only. In this example, the tuning device 14 is configured to apply a suitable gate voltage, $V=V_D$ so the dielectric constant of the graphene sheet 18 inside the waveguide 12(1) can be tuned to be very small, resulting in greatly enhanced absorption modes. The tuning device 14 also is configured to withhold the gate voltage, $V=0$ so the dielectric constant of the graphene sheet 18 is quite large, and the waveguide 12(1) works at low absorption state within a short propagation distance.

Figure 4B:
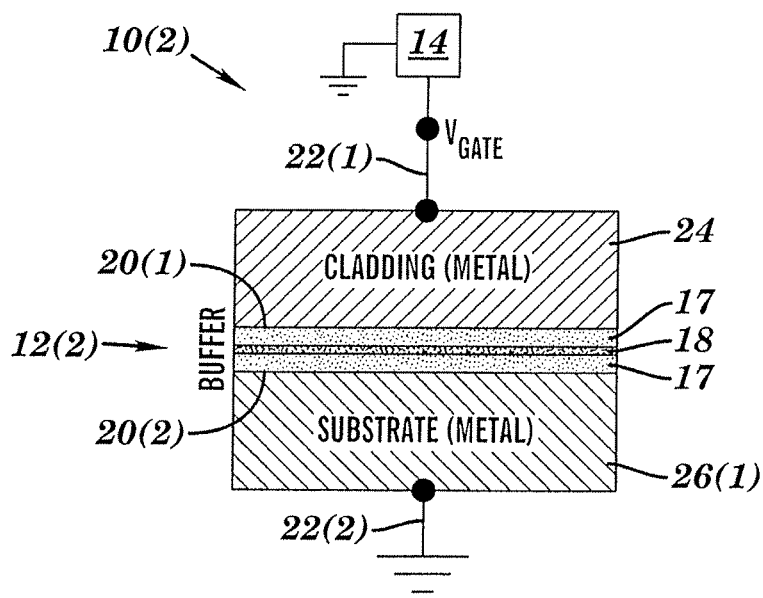
FIG. 4(b) is a side view of a graphene-slot dielectric waveguide.

Referring to FIG. 4(b), the electro-optical waveguide apparatus 10(2) includes a graphene-slot dielectric waveguide 12(2) and a tuning device 14, although other types of waveguides, other types and numbers of layers, elements or other components, made of other materials, and in other configurations could be used. The electro-optical waveguide apparatus 10(2) including the graphene-slot dielectric waveguide 12(2) and the tuning device 14 is the same in structure and operation as the electro-optical waveguide apparatus 10(1) including the graphene-slot plasmonic waveguide 12(1) and the tuning device 14 except as illustrated and described herein. Elements in the electro-optical waveguide apparatus 10(2) including the graphene-slot dielectric waveguide 12(2) and the tuning device 14 which are like those in the electro-optical waveguide apparatus 10(1) including the graphene-slot plasmonic waveguide 12(1) and the tuning device 14 will have like reference numerals.

The graphene-slot dielectric waveguide 12(2) includes buffer layers 17 made of $Si_3N_4$, a metal cladding layer 24 made of copper and a metal substrate 26(1) made of copper, the graphene sheet 18, and the control electrodes 22(1) and 22(2), although other types of waveguides, other types and numbers of layers, elements or other components made of other materials, and in other configurations could be used. The metal cladding layer 24 is located on a buffer layer 17 which is over the surface 20(1) of the graphene sheet 18 and the metal substrate 26(1) is located on another buffer layer 17 over the surface 20(2) of the graphene sheet 18, although there may be other numbers and types of layers on one side or both sides of the graphene sheet 18. In this example, the metal cladding layer 24 and the metal substrate 26(1) have substantially the same width, although other dimensions for each could be used. One of the control electrodes 20(1) is coupled to the metal cladding layer 24 and the other control electrode 20(2) is coupled to the metal substrate 26(1), although other types, numbers and manners of electrical connections could be used.

Referring to FIGS. 5(a-f), additional illustrative examples of graphene-slot waveguides 12(1)-12(7) are shown and described in greater detail below, although other types of waveguides with other types and numbers of layers in other arrangements can be used. Elements within waveguides 12(1)-12(7) which are like other elements in those in other of the waveguides 12(1)-12(7) will have like reference numerals. For ease of illustration, the tuning device 14 and control electrodes 22(1)-22(7) are not shown in these examples.

Referring to FIG. 5(a), the dielectric waveguide 12(3) includes the dielectric layers 16(1) and 16(2) made of silicon, buffer layers 17 made of $Si_3N_4$, the graphene sheet 18, the substrate layer 26(2) made of silicon dioxide, and the control electrodes 20(1) and 20(2), although other types of waveguides, other types and numbers of layers, elements or other components made of other materials, and in other configurations could be used. The dielectric layer 16(1) is located on a buffer layer 17 which is over surface 20(1) of the graphene sheet 18 and the dielectric layer 16(2) is located on another buffer layer 17 which is over surface 20(2) of the graphene sheet 18, although there may be other numbers and types of layers on one side or both sides of the graphene sheet 18. In this example, the dielectric layers 16(1) and 16(2) have substantially the same width, although other dimensions for each could be used. The substrate layer 26(2) is on an opposing surface of the dielectric layer 16(2), although other types and numbers of layers in other configurations could be used.

Referring to FIG. 5(b), the dielectric strip waveguide 12(4) includes the dielectric layers 16(3) and 16(4) made of silicon, buffer layers 17 made of $Si_3N_4$, the graphene sheet 18, the substrate 26(3) made of silicon dioxide, and the control electrodes 20(1) and 20(2), although other types of waveguides, other types and numbers of layers, elements or other components, made of other materials, and in other configurations could be used. The dielectric layer 16(3) is located on a buffer layer 17 which is over surface 20(1) of the graphene sheet 18 and the dielectric layer 16(4) is located on another buffer layer 17 which is over surface 20(2) of the graphene sheet 18, although there may be other numbers and types of layers on one side or both sides of the graphene sheet 18. In this example, the dielectric layer 16(3) is narrower than then dielectric layer 16(2), although other dimensions for each could be used. The substrate 26(3) is on an opposing surface of the dielectric layer 16(4), although other types and numbers of layers in other configurations could be used.

Referring to FIG. 5(c), the metal-insulator-metal or graphene-slot dielectric waveguide 12(2) was previously illustrated and described in FIG. 4(b) and thus will not be described here again.

Referring to FIG. 5(d), a metal strip waveguide 12(5) includes buffer layers 17 made of $Si_3N_4$, a metal cladding layer 24 made of copper and a metal substrate 26(4) made of copper, the graphene sheet 18, and the control electrodes 22(1) and 22(2), although other types of waveguides, other types and numbers of layers, elements or other components, made of other materials, and in other configurations could be used. The metal cladding layer 24 is located on a buffer layer 17 which is over the surface 20(1) of the graphene sheet 18 and the metal substrate 26(4) is located on another buffer layer 17 which is over the surface 20(2) of the graphene sheet 18, although there may be other numbers and types of layers on one side or both sides of the graphene sheet 18. In this example, the metal cladding layer 24 is narrower than the metal substrate 26(4), although other dimensions for each could be used.

Figure 5E:
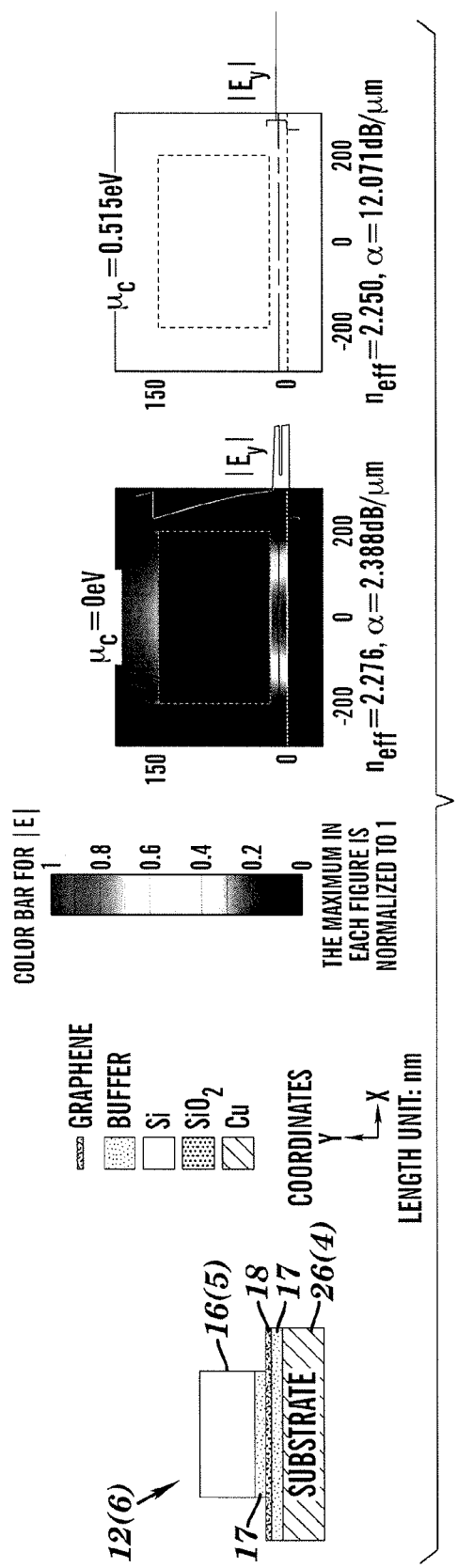
FIG. 5(a-f) are side views and graphs of transverse electric field profiles, effective indices, and propagation loss for different exemplary graphene-slot waveguides at $\mu c=0$ and $\mu c=\mu D$, respectively: (a) in a dielectric waveguide; (b) in a dielectric strip waveguide; (c) in a metal-insulator-metal waveguide; (d) in a metal strip waveguide; (e-f) in photonic-plasmonic hybrid waveguides.

Referring to FIG. 5(e), a photonic-plasmonic hybrid waveguide 12(6) includes a dielectric layer 16(5) made of silicon, buffer layers 17 made of $Si_3N_4$, the metal substrate 26(4) made of copper, the graphene sheet 18, and the control electrodes 22(1) and 22(2), although other types of waveguides, other types and numbers of layers, elements or other components made of other materials, and in other configurations could be used. The dielectric layer 16(5) is located on a buffer layer 17 which is over the surface 20(1) of the graphene sheet 18 and the metal substrate 26(4) is located on another buffer layer 17 which is over the surface 20(2) of the graphene sheet 18, although there may be other numbers and types of layers on one side or both sides of the graphene sheet 18. In this example, the dielectric layer 16(5) is narrower than the metal substrate 26(4), although other dimensions for each could be used.

Figure 5F:
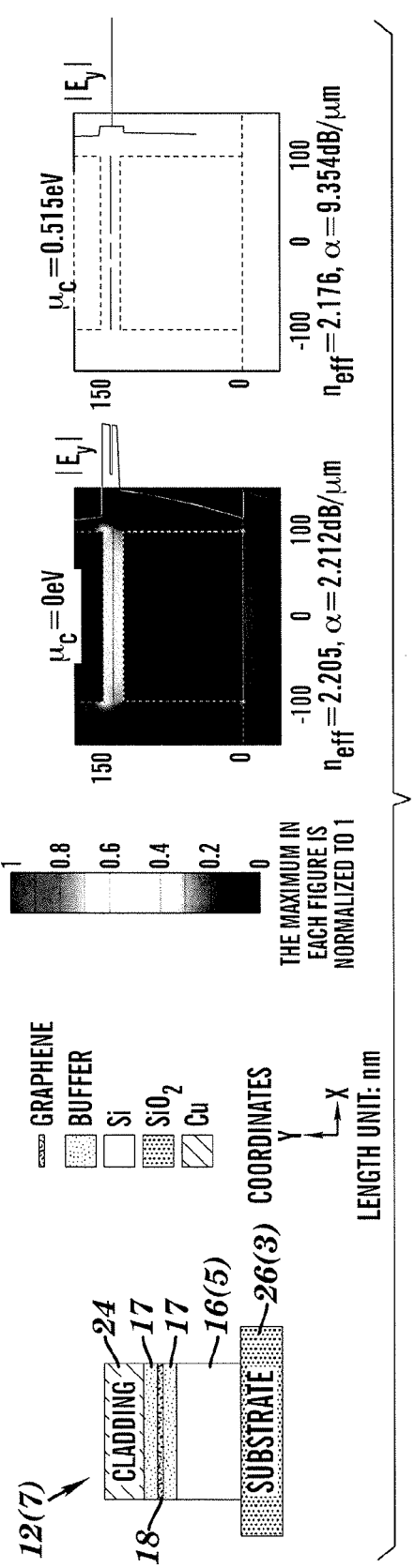

Referring to FIG. 5(f), another photonic-plasmonic hybrid waveguide 12(7) includes buffer layers 17 made of $Si_3N_4$, the metal cladding layer 24 is made of copper, the dielectric layer 16(5) is made of silicon, the substrate 26(3) is made of silicon dioxide, the graphene sheet 18, and the control electrodes 22(1) and 22(2), although other types of waveguides, other types and numbers of layers, elements or other components made of other materials, and in other configurations could be used. The metal cladding layer 24 is located on a buffer layer 17 which is over the surface 20(1) of the graphene sheet 18 and the dielectric layer 16(5) is located on another buffer layer 17 which is over the surface 20(2) of the graphene sheet 18, although there may be other numbers and types of layers on one side or both sides of the graphene sheet 18. In this example, the dielectric layer 16(5) and the metal cladding layer 24 have substantially the same width, although other dimensions for each could be used. The substrate 26(3) is on an opposing surface of the dielectric layer 16(5), although other types and numbers of layers in other configurations could be used.

Exemplary operations of electro-optical waveguide apparatuses with examplary waveguides 12(1)-12(7) and the tuning device 14 coupled across the control electrodes 22(1) and 22(2) to the examplary waveguides 12(1)-12(7) as illustrated in the examples herein will now be discussed below. With a suitable gate voltage, $V=V_D$, applied by for example the tuning device 14 across the control electrodes 22(1) and 22(2) coupled to the exemplary waveguides 12(1)-12(7), the dielectric constant of the graphene sheet 18 inside one of the examplary waveguides 12(1)-12(7) used in the electro-optical waveguide apparatus 10 can be tuned to be very small due to the effect of intraband electronic transition resulting in greatly enhanced absorption modes. Without the gate voltage being applied by applied by the tuning device 14 across the control electrodes 22(1) and 22(2), the dielectric constant of the graphene sheet 18 inside one of the examplary waveguides 12(1)-12(7) used in the electro-optical waveguide apparatus 10 is quite large, and the one of the examplary waveguides 12(1)-12(7) works at low absorption state within a short propagation distance. Note V=0→on-state, and $V=V_D$→off-state. Thus, the electro-optical waveguide apparatus 10 operates as a graphene electro-optic modulator.

Due to the extremely enhanced light absorption, saturable absorption and other nonlinear effects may become obvious when the signal power increases to some level. Therefore, one weak optical signal (with wavelength $\lambda_1$) may be switched on/off by another strong optical signal (with wavelength $\lambda_2$) using the electro-optical waveguide apparatus 10, where a DC bias voltage results in the maximum absorption of $\lambda_2$. The result is the electro-optical waveguide apparatus 10 operating as a graphene all-optic modulator, where one optical signal can be used to operate another optical signal.

When working at high absorption modes under a suitable DC bias, the exemplary graphene-slot waveguides 12(1)-12(7) also can be used as the key components of ultra-fast optical detectors with suitable external circuits.

A theory of an exemplary operation of electro-optical waveguide apparatuses with examplary waveguides 12(1)-12(7) and the tuning device 14 coupled across the control electrodes 22(1) and 22(2) will now be discussed below.

Optical properties based on small signal analysis have been studied. Two absorption processes coexist in the light-graphene interaction, namely interband absorption and intraband absorption, which can be evaluated by a complex conductivity $$\sigma_g = \sigma_{intra}(\omega,\mu_c,\Gamma,\tau) + \sigma_{inter}(\omega,\mu_c,\Gamma,\tau),$$

depending on the chemical potential $\mu_c$, and charged particle scattering rate $\Gamma$. The chemical potential $\mu_c$ can be controlled by electrical gating. Thus, the conductivity of graphene sheet 18 can be dynamically tuned by gate voltage $V_D$ by the tuning device 14 in real time. Basically, when $\mu\mu_c < \hbar\omega/2$, interband absorption dominates and the graphene sheet 18 becomes absorptive; otherwise, quite transparent. Electrically switching on/off interband absorption of the graphene sheet 18 results in modulation.

Figure 6A:
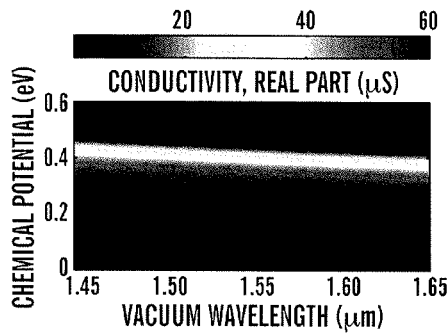
FIGS. 6(a-f) are graphs and diagrams of (a) a real part and imaginary part (b) of the graphene conductivity as a function of chemical potential and wavelength (T=300K) based on the Kubo formula; (c) the graphene conductivity as a function of chemical potential at $\lambda 0=1550$ nm; (d) the dielectric constant (real part, imaginary part, and magnitude) as the function of chemical potential at $\lambda 0=1550$ nm; (e) a side view of an exemplary graphene-slot waveguide with a ten nm thick $Si_3N_4$ buffer layer on each side of graphene; and (f) The transverse electric magnitude plots across the waveguide at $\mu c=0$ and $\mu c=\mu t$.
Figure 6B:
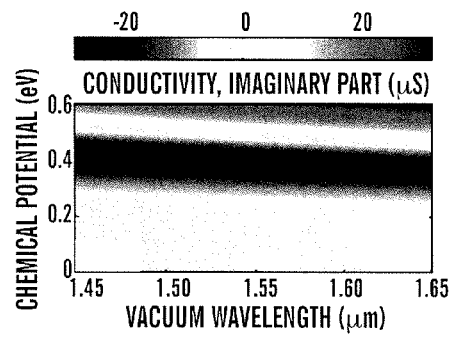
Figure 6C:
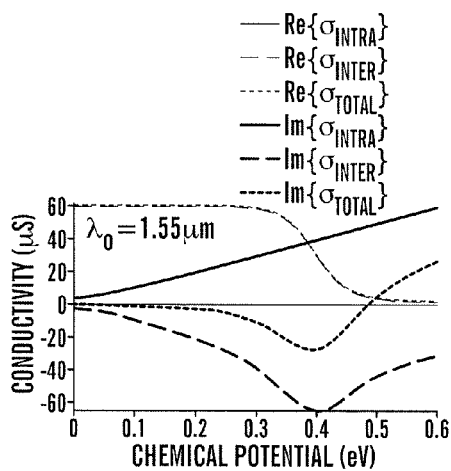
Figure 6D:
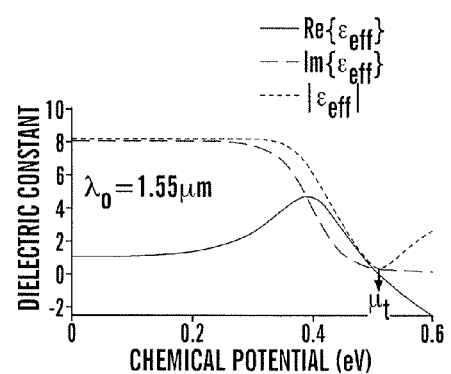

The intraband absorption can be equally important in by way of example the electro-optical waveguide apparatus 10(1) with the examplary waveguide 12(1) and the tuning device 14 coupled across the control electrodes 22(1) and 22(2). The conductivity of the graphene sheet 18 was calculated at T=300K. FIGS. 6(a-b) are plots of the real and imaginary parts of the conductivity as a function of the chemical potential and wavelength in the near infrared regime. In particular, the real part of conductivity is very sensitive to chemical potential, as shown in FIG. 6(c). FIG. 6(c) also shows how interband absorption and intraband absorption contribute to the conductivity of the graphene sheet 18, respectively. FIG. 6(d) plots the corresponding dielectric constant (real part, imaginary part, and magnitude), $$\varepsilon_{eff}(\mu_c) = 1 - \frac{\sigma_v}{j\omega\varepsilon_0} = 1 - \frac{\sigma_g}{j\omega\varepsilon_0\Delta},$$

where $\Delta$ is the effective thickness of graphene. The dielectric constant of graphene sheet 18 varies from $\varepsilon_{eff}(0\text{ eV})=0.985+j8.077$ to $\varepsilon_{eff}(0.6\text{ eV})=-2.508+j0.182$ at $\lambda_0=1.55$ μm. Note the sign of the real part flips due to intraband absorption because the interband absorption and intraband absorption contribute the imaginary part of conductivity with different signs as shown in FIG. 6(c). As a result, there is a dip in the curve of dielectric constant magnitude. In this example, the "turning chemical potential" is $\mu_t=0.515$ eV and $|\varepsilon_{eff}(\mu_t)|=|-0.048+j0.323|=0.327$, which means the magnitude varies about $|\varepsilon_{eff}(0)|/|\varepsilon_{eff}(\mu_t)|\approx 25$ times. Note the intraband absorption plays a key role in reducing the magnitude of dielectric constant.

Figure 6E:
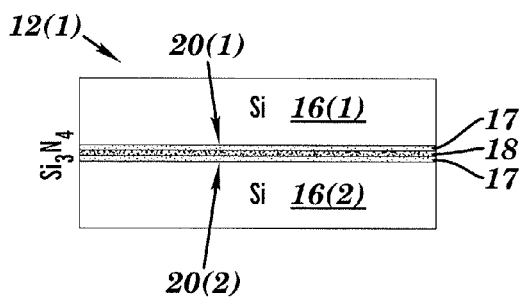

In particular, with this exemplary technology the absorption can be greatly enhanced when graphene 18 is sandwiched inside an exemplary silicon waveguide 12(1), forming a graphene-slot waveguide as illustrated in FIGS. 4(a) and 6(e). In this graphene-slot waveguide 12(1), the magnitude of transverse electric field $|E_y|$, and hence absorption, is roughly inversely proportional to that of the dielectric constant. The absorption per unit area $$p_d = \tfrac{1}{2}Re\{\sigma_g\}E^2 \propto \tfrac{1}{2}E \cdot Im\{\in_{eff}\}/|\in_{eff}|,$$

can be greatly enhanced at $\mu_c=\mu_t$ because (1) $|E_y|$ reaches its maximum and (2) $Im\{\in_{eff}\}/|\in_{eff}|$ nearly grows to its maximum at the same time. See FIG. 6(d).

Figure 6F:
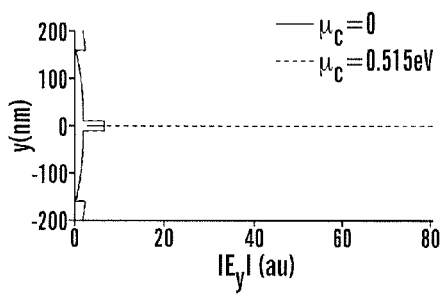

To verify this, first consider the multilayer stack as illustrated in FIGS. 4(a) and 6(e), where graphene 18 is sandwiched in the silicon waveguide 12(1) with a 10-nm $Si_3N_4$ buffer layer 17 on each side and then an outer layer of silicon 16(1) and 16(2) on each side of the buffer layer 17, although the buffer layer and outer layers can each be made of other types and numbers of layers and of other types of materials. Based on the fast 2D mode solver, the optimized silicon thickness to enhance light absorption is found to be about 150 nm. FIG. 6(f) plots the $|E_y|$ profiles at $\mu_c=0$ and $\mu_c=\mu_t$, respectively. The absorption is roughly proportional to $|E_y|$, with an enhancement about twenty five times. With this exemplary technology, $\mu_c=0$ is the transparence state, while $\mu_c=\mu_t$ is the absorption state, which are exactly opposite to the operation principle of prior art EO modulators.

Once the configuration of the exemplary graphene-slot waveguides 12(1)-12(7) are optimized as illustrated and described herein, the optimal waveguide width may be determined based on a finite-difference time-domain (FDTD) method. Considering the fabrication tolerance, the optimal width of the exemplary graphene-slot waveguides 12(1)-12(7) are found to be about 450 nm in this illustrative example, although other widths may be used. The mode profiles of the graphene-slot waveguide 12(1) at different chemical potentials is shown in FIG. 5(a). There is only a slight shift in the effective index: 2.032 at $\mu_c=0$ and 2.034 at $\mu_c=\mu_t$. In contrast, there is a huge change in the waveguide attenuation. At $\mu_c=0$, the $|E_y|$ in the graphene 18 is even lower than in the $Si_3N_4$ buffer layers 17, and the waveguide works at the low loss state with $a_0=0.183$ dB/µm; at $\mu_c=\mu_t$, the $|E_y|$ in the graphene is many times higher than in the $Si_3N_4$ buffer layers 17 and the waveguide 12(1) works at the high absorption state with $a_v=4.603$ dB/µm. As a result, modulation depth 4.42 dB/µm can be achieved, and 3 dB-modulation depth only requires 679 nm propagation distance. An 800-nm propagation distance results in a modulation depth 3.54 dB. Additionally, with this technology a graphene EO modulator with waveguide 12(1) can be made on the nanoscale. For the sake of easy fabrication, the silicon modulator with the waveguide 12(2) can also take the form of an asymmetric slot waveguide as shown in FIG. 5(b) and there is only a slight change in the performance.

Further, highly confined modes can be achieved in plasmonic waveguides. Based on nanoplasmonic platforms, the dimensions of a graphene modulator should be even smaller. Following the same approach, the interaction between graphene 18 and various plasmonic modes was investigated. FIGS. 5(c-d) list the guided mode profiles, effective indices, and attenuation of graphene-slot waveguides 12(2) and 12(5) based the metal-insulator-metal plasmonic platform. FIGS. 5(e-f) list the mode calculation of graphene-slot waveguides based on the hybrid plasmonic platform. As can be seen in FIG. 5(d), a 3-dB (3.82 dB at 1550 nm) EO modulator can be made within 120 nm using the metal strip plasmonic waveguide 12(5), where the attenuations are 6.76 dB/µm at $\mu_c=0$ and 38.59 dB/µm at $\mu_c=0.518$ eV.

The exemplary waveguides 12(1)-12(7) illustrated and described herein may find numerous applications including by way of example only:

Electro-optic modulators: Note the absorption of one of the exemplary graphene-slot waveguides 12(1)-12(7) can be switched between low absorption state ("on-state" at V=0) and high absorption state ("off-state" at $V=V_D$) by the gate voltage across the waveguide. With the electro-optic properties of graphene ultrafast graphene electro-optic modulators with one of the exemplary graphene-slot waveguides 12(1)-12(7) can be made.

All-optic modulators: Due to the extremely enhanced light absorption, saturable absorption and other nonlinear effects may become obvious when the signal power increases to some level. Therefore, one weak optical signal (with wavelength $\lambda_1$) may be switched on/off by another strong optical signal (with wavelength $\lambda_2$) using a graphene modulator, where a DC bias voltage results in the maximum absorption of $\lambda_2$. The result is graphene all-optic modulators with one of the exemplary graphene-slot waveguides 12(1)-12(7), where one optical signal can be used to operate another optical signal.

Optical detectors: When working at high absorption modes under a suitable DC bias, one of the exemplary graphene-slot waveguides 12(1)-12(7) can also be used as the key components of ultra-fast optical detectors with suitable external circuits.

Figure 1A:
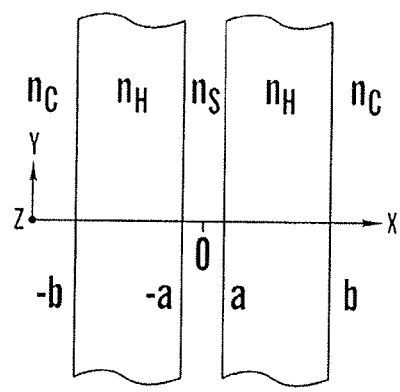
FIG. 1 is a top view and perspective end view of a prior art slot waveguide for enhancing and confining light in a nanometer-wide low-index material.
Figure 1B:
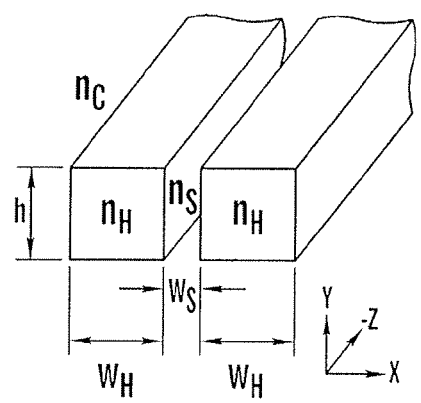

There are numerous exemplary differences between this technology and the prior technologies disclosed in the background. For example, with respect to the prior art slot waveguide illustrated in FIG. 1, high light intensity can be excited when a low-index thin film is sandwiched inside a dielectric waveguide. In this prior waveguide the sandwiched film needs to have a lower refractive index than the dielectric waveguide.

In contrast, graphene-slot waveguides 12(1)-12(7) in accordance with examples of this technology can be formed by simply sandwiching graphene inside a dielectric waveguide without any dielectric slot at all. The buffer layers 17, in the graphene-slot waveguides 12(1)-12(7) in the examples illustrated and described herein are used to apply a gate or bias voltage, and their refractive indices do not have to be lower than that of the dielectric waveguide (the higher, the better). Additionally, a graphene-sandwiched waveguide cannot naturally work as a slot waveguide and only work as a result of this exemplary technology at a suitable gate voltage.

Figure 2:
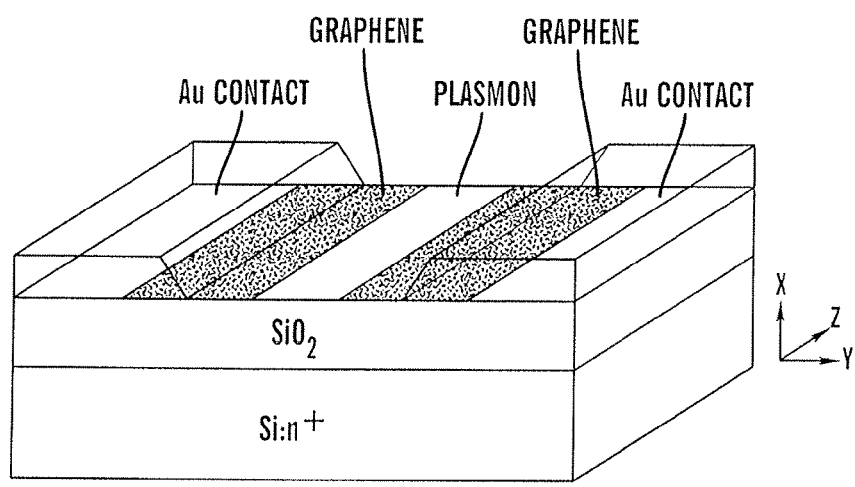
FIG. 2 is a perspective side view of a prior art graphene-based surface plasmon modulator.

With respect to the prior art graphene-based surface plasmon modulator illustrated in FIG. 2, this prior art modulator works by switching on/off surface plasmons at graphene surfaces. Its working frequencies are limited to those where graphene barely supports surface plasmons. As a result, this requirement can be satisfied only in the long-wave infrared regime (8 µm<wavelength<15 µm) limiting the utility of these prior art modulators.

In contrast, examples of this technology work by switching on/off photonic modes inside the exemplary waveguides in accordance with examples of this technology. Graphene in these waveguides do not support surface plasmons and can work at telecommunication wavelengths (1.3 µm<wavelength<1.6 µm).

Figure 3:
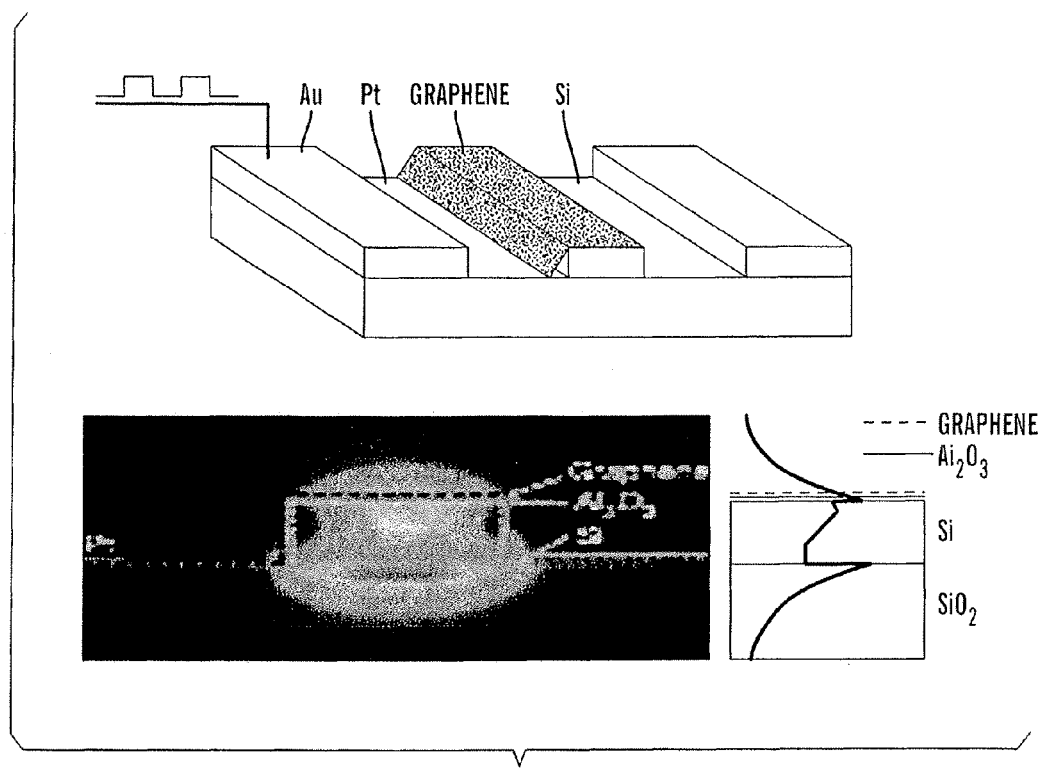
FIG. 3 is a perspective side view, cross-sectional view and diagram of another prior art graphene optical modulator.
Figure 7:
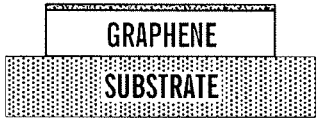
FIG. 7 is a table with examples of differences between the prior art graphene optical modulator shown in FIG. 3 and exemplary slot waveguides shown in FIGS. 5(a) and 5(d).

With respect to the prior art graphene optical modulator illustrated in FIG. 3 and referring to the table illustrated in FIG. 7, electrically switching on/off graphene interband absorption plays the key role. Low chemical potential of graphene works as the absorption (off-) state, and high chemical potential of graphene works as the transparence (on-) state, i.e. ($\mu_c=0$)→off-state, and (large $\mu_c$)→on-state.

In contrast, the operation of modulators in accordance with examples of this technology, the intraband absorption is equally important as the interband absorption. In these modulators, $\mu_c=0$ is the transparence (on-) state, while a specific $\mu_c=\mu_t$ is the absorption (off-) state, i.e. ($\mu_c=0$)→on-state, and ($\mu_c=\mu_t$)→off-state, which are exactly opposite to the operation principle of the prior modulator.

Additionally, construction of exemplary waveguides, such as exemplary graphene-slot waveguides 12(1)-12(7), is different from the prior art. With prior art graphene modulators, the graphene is coated on the surface of a waveguide, resulting in a conventional dielectric waveguide. These prior graphene modulators also work by controlling the absorption of evanescent waves.

In contrast, modulators with exemplary waveguides, such as exemplary graphene-slot waveguides 12(1)-12(7), have graphene sandwiched inside the exemplary waveguide 12(1)-12(7), resulting in a graphene-slot waveguide. Additionally, the platform for these can be either a dielectric or metallic waveguide as illustrated in the examples shown in FIGS. 5(a-f). Further, the modulated waves with the modulators with exemplary waveguides, such as exemplary graphene-slot waveguides 12(1)-12(7), are different and work by tuning with the tuning device 14 to tune the absorption greatly enhanced propagating waves.

In another example of this technology, use of epsilon-near-zero (ENZ) materials in optical modulators is illustrated in FIGS. 8-11(d) and described herein. When a thin epsilon-near-zero film is sandwiched in a single mode waveguide, an epsilon-near-zero-slot waveguide is formed, where the absorption can be greatly enhanced. Example of electro-absorption modulators based on tunable epsilon-near-zero materials and slot waveguides are illustrated and described herein. For example, transparent conducting oxides (TCOs) may be employed as the active slot which can be tuned between epsilon-near-zero (high absorption) and epsilon-far-from-zero (low absorption) by accumulation carriers. Numerical simulation shows that over 3-dB modulation depth can be achieved in a 150-nm long TCO-slot waveguide. The modulators have the advantages of nanoscale footprints, small insertion loss, potentially ultrahigh speed, and easy fabrication.

Light absorption can be greatly enhanced in an ENZ-slot waveguide even when the slot width is less than 1 nm. In that case, graphene works as a tunable ENZ material. ENZ material has many advantages as an EO material including by way of example: (1) sharply enhanced absorption can be achieved in an ultrathin slot; (2) the ultrathin slot does not introduce a large insertion loss; and (3) an ENZ material often has tunable optical properties because a small change in carrier density will result in a significant change in dielectric constant.

The ENZ effect can be found in almost any material at $\omega \approx \omega_p/\sqrt{\epsilon_\infty}$ according to the Drude model for dielectric constant, $$\varepsilon = \varepsilon_\infty - \frac{\omega_p^2}{\omega(\omega+j\gamma)},$$

where $\epsilon_\infty$ is the high frequency dielectric constant, $\omega_p$ is the plasma frequency, and $\gamma$ is the electron damping factor. For example, $|\epsilon(\text{tungsten})|=0.483$ at $\lambda_0=48.4$ nm, and $|\epsilon(\text{aluminum})|=0.035$ at $\lambda_0=83$ nm. However, the plasma frequencies of most metals are located in the ultraviolet regime due to their extreme high carrier concentration. Note $$\omega_p = \sqrt{\frac{Ne^2}{\varepsilon_0 m^*}},$$

(depending on carrier concentration N, and the effective electron mass m*. To shift the plasma frequency into the near infrared (NIR) regime for telecom applications, the carrier concentration should reduce to $10^{20} \sim 10^{21}/\text{cm}^3$, which coincides that of transparent conducting oxides (TCOs). Their well-known representatives are indium tin oxide (ITO) and indium zinc oxide (IZO), which are degenerately doped semiconductors widely used as transparent electrodes in displays. Unity-order index change in a TCO can be achieved in a metal-oxide-semiconductor structure by voltage-induced accumulation charge.

Figure 8:
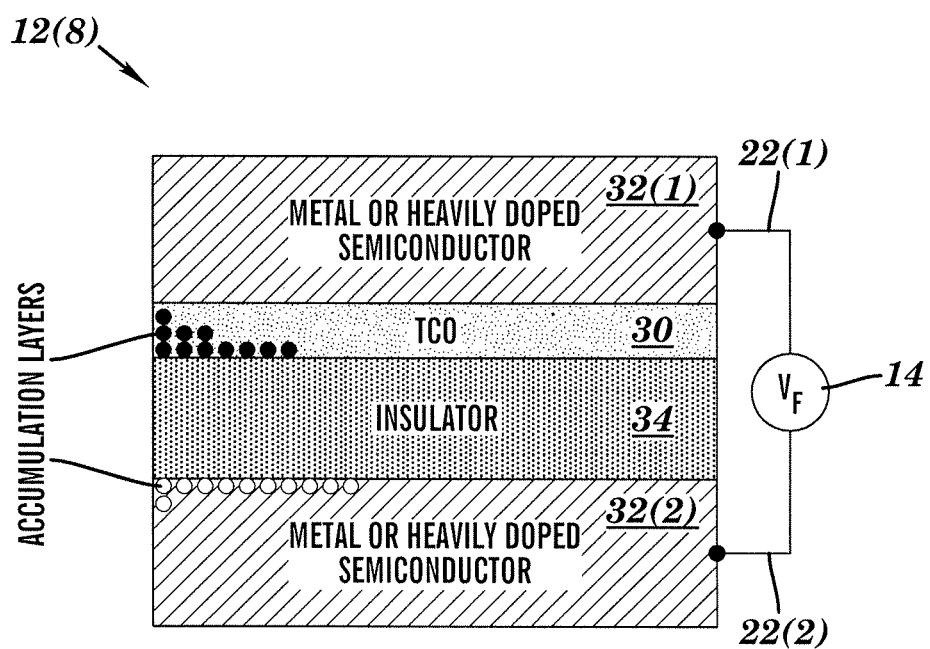
FIG. 8 is a side cross-sectional view of an electro-optical waveguide apparatus with an exemplary epsilon-near-zero waveguide.

Referring to FIG. 8, an example of an exemplary epsilon-near-zero waveguide 12(8) is illustrated. In this example, the waveguide 12(8) includes a ten nm thick transparent conducting oxide film 30 made of ITO is sandwiched in two metals slabs 32(1) and 32(2) made of gold with a thirty nm thick SiO$_2$ buffer layer 34, although other types of waveguides, other types and numbers of layers, elements or other components, made of other materials, and in other configurations could be used. It is also known as a metal-insulator-metal (MIM) plasmonic waveguide 12(8), where a well confined transverse magnetic (TM) plasmonic mode can be excited between the two metals slabs 32(1) and 32(2). The magnetic field is parallel to the metals slabs 32(1) and 32(2). At the interface between buffer layer 34 and ITO film 30, the continuity of normal electric flux density $\epsilon_{ITO}(E_{ITO})_y = \epsilon_{SiO_2}(E_{SiO_2})_y$ is applicable, where the free charge effect is included in the complex dielectric constant. Thus, very high electric field can be excited when $|\epsilon_{ITO}| \to 0$. In other words, an ENZ-slot can sharply enhance the electric field in the slot. Without loss of generality, assume the dielectric constant of ENZ-slot to be $$\varepsilon = \varepsilon' + j\varepsilon'' = \varepsilon' + \frac{j\sigma}{\omega \varepsilon_0}.$$

The dissipation power density $$p_d = \frac{1}{2}\sigma E^2 \propto \frac{1}{2}\varepsilon'' E^2 \propto \frac{1}{2}\varepsilon'' /|\varepsilon|^2$$

can be greatly enhanced when $|\epsilon| \to 0$. The absorption of the ENZ-slot can even be many times than that of the metals slabs 32(1) and 32(2) in the waveguide 12(8) as can be seen in the following context.

Figure 9A:
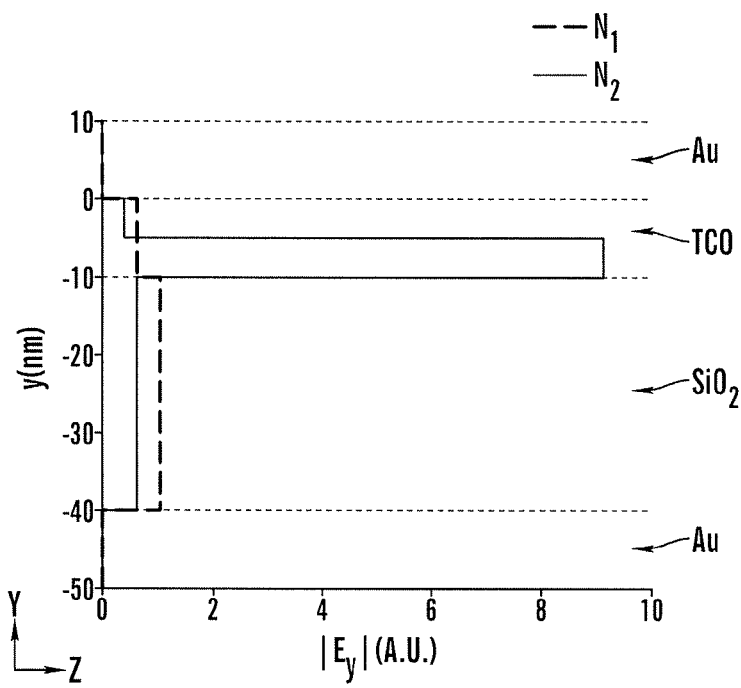
FIG. 9(a) is a graph of a plot of the transverse electric field magnitude across the epsilon-near-zero slot MIM plasmonic waveguide at $N=N_1$ and $N=N_2$, respectively.
Figure 9B:
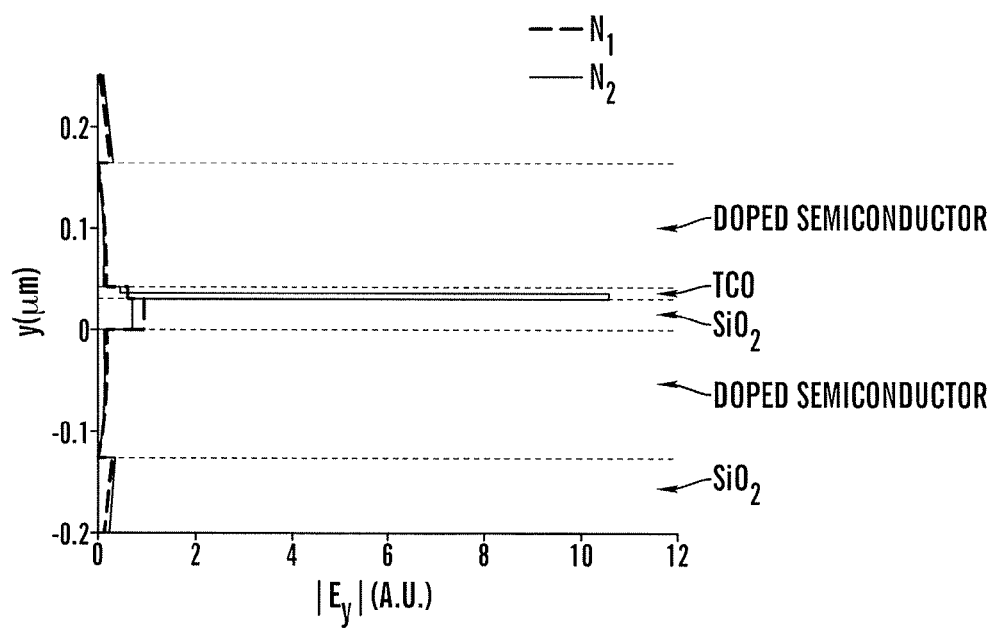
FIG. 9(b) is a graph of a plot of the transverse electric field magnitude across the epsilon-near-zero slot dielectric waveguide at $N=N_1$ and $N=N_2$.

Based on the transfer matrix method, the TM mode supported by the Au-ITO-SiO$_2$-Au stack or waveguide 12(8) was solved, i.e. a two-dimensional ITO-slot MIM plasmonic waveguide. The dielectric constant of Au is $-63.85+j5.07$ at $\lambda_0=1136$ nm. Two cases are considered: (1) without gate voltage, $N=N_1$ and the 10-nm ITO layer has dielectric constant $\epsilon_1=3.2074+j0.5867$; (2) without a suitable gate voltage, $N=N_2$ and the 10-nm ITO layer is split into two, namely 5-nm unaffected layer with $\epsilon_1=3.2074+j0.5867$ and 5-nm accumulation layer with $\epsilon_2=-0.0014+j0.1395$. As shown in FIG. 9(a), the electric field can be greatly enhanced in the accumulation layer at $\lambda_0=1136$ nm when carrier concentration increases from $N_1$ to $N_2$. In particular, the magnitude of $E_y$ increases about 9.2 times. In addition, similar level of enhancement can be achieved when the ENZ-slot is sandwiched in a dielectric waveguide. FIG. 9(b) shows the mode profiles of an ENZ-slot dielectric waveguide 12(8) at $N_1$ and $N_2$. The top and bottom dielectric layers, each 125 nm thick, are assumed to be heavily doped semiconductor with refractive index 3.45.

Based on the sandwiched structure, a three-dimensional mode solver was used to determine the optimal waveguide width based on the FDTD method. Considering the fabrication tolerance, the optimal width of the waveguide is found to be 200 nm. FIG. 9(b) shows the mode profiles of the ITO-slot plasmonic waveguide at different carrier concentrations. There is a considerable shift in the effective index: 1.99 at $N=N_1$, and 1.09 at $N=N_2$. Thus, quite compact phase modulators may be achieved. More importantly, there is a huge change in the waveguide attenuation. At $N=N_1$, the $|E_y|$ in the ITO is even lower than in the $SiO_2$ buffer layers, and the waveguide works at the low loss state with $a_1=2.92$ dB/µm; at $N=N_2$, the $|E_y|$ in the accumulation layer is many times higher than in the $SiO_2$ buffer layers, and the waveguide works at the high absorption state with $a_2=23.56$ dB/µm. As a result, modulation depth 20.64 dB/µm can be achieved, and 3 dB-modulation depth only requires 146 nm propagation distance. Based on the film stack shown in FIG. 8, a dielectric modulator can be designed. FIG. 9(b) shows the mode profiles of the ITO-slot dielectric modulator at different carrier concentrations. A similar modulation effect can be achieved. The dielectric modulator may find more practical applications.

Figure 10A:
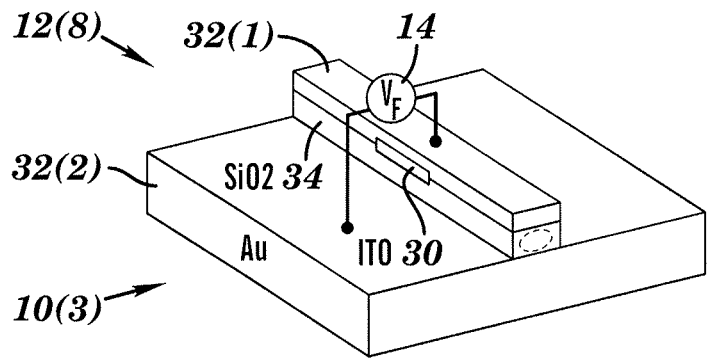
FIG. 10(a) is a perspective view of an exemplary electro-absorption (EA) modulator embedded on a rib silicon waveguide.
Figure 10B:
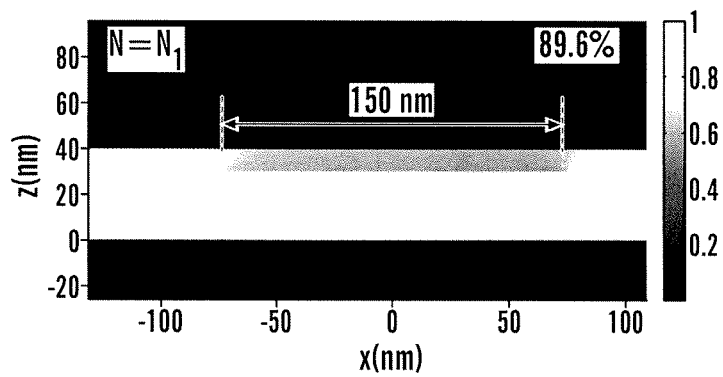
FIG. 10(b) is a diagram of a three dimensional simulation of light propagation between the rib silicon waveguide and the EA modulator at $N=N_1$.
Figure 10C:
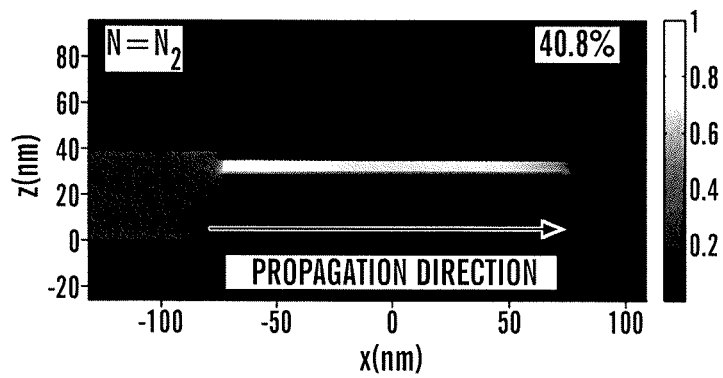
FIG. 10(c) is a diagram of a three dimensional simulation of light propagation between the rib silicon waveguide and the EA modulator at $N=N_2$.

To evaluate the insertion loss of the EA modulators, three-dimensional FDTD simulations were performed with the smallest mesh size down to 0.5 nm. In the simulations, the modulators 10(3) and 10(4) are assumed to be embedded in a semiconductor waveguide with same overall dimensions as themselves, except without the ITO and buffer layers. The modulator 10(3) with waveguide 12(8) is first simulated based on the plasmonic waveguide platform as shown in FIG. 10(a). The length of the EA modulator 10(3) is 150 nm. Referring to FIGS. 10(b-c) the power distribution in the waveguide at $N=N_1$ and $N=N_2$, respectively, is shown. Simulation results demonstrate that the overall throughput is 89.6% at $N=N_1$, and 40.8% at $N=N_2$. Note that the insertion loss is only 0.48 dB (89.6%). The achievable modulation depth, 3.42 dB, is very close to the one predicted by the three-dimensional mode solver.

Figure 10D:
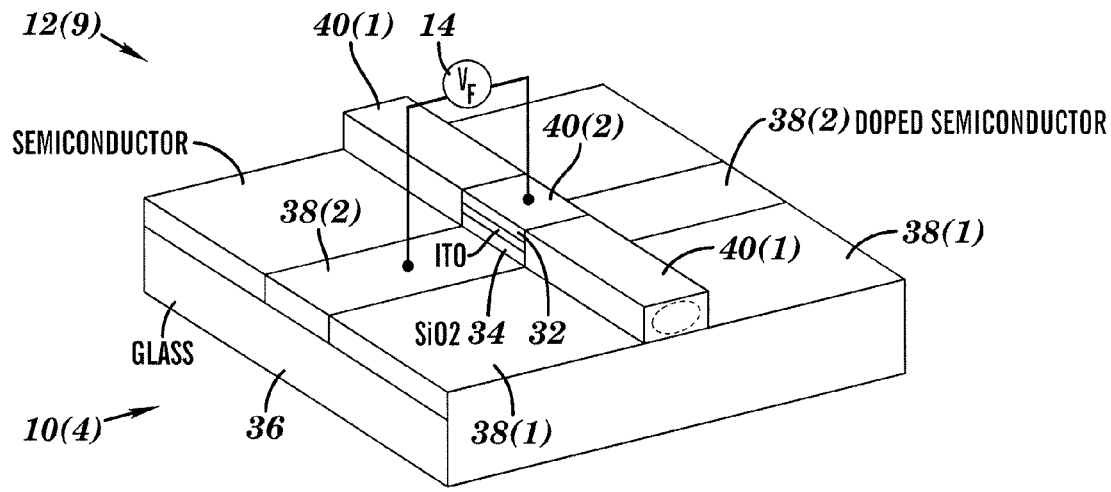
FIG. 10(d) is a perspective view of an exemplary electro-absorption (EA) modulator embedded over etched rib silicon waveguide
Figure 10E:
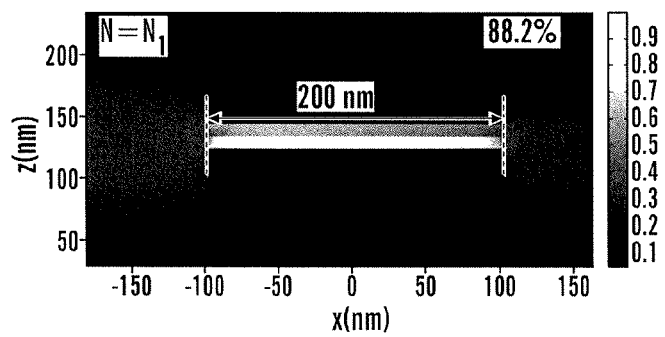
FIG. 10(e) is a diagram of three dimensional simulation of light propagation between an over the etched rib silicon waveguide and the EA modulator at $N=N_1$ and $N=N_2$.
Figure 10F:
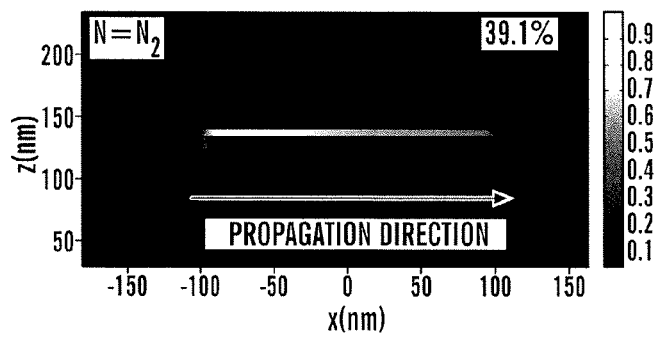
FIG. 10(f) is a diagram of three dimensional simulation of light propagation between an over the etched rib silicon waveguide and the EA modulator at $N=N_2$

The modulator 10(4) with the waveguide 12(9) also is simulated based on the dielectric waveguide platform as shown in FIG. 10(d). The length of the EA modulator 10(4) is 200 nm. The waveguide 12(9) includes a glass substrate 36, an undoped semiconductor 38(1), a doped semiconductor strip 38(2), an insulator 34, a TCO layer 30, an undoped semiconductor 40(1), a doped semiconductor 40(2), and a tuning device 14, although other types of waveguides, other types and numbers of layers, elements or other components, made of other materials, and in other configurations could be used. The undoped semiconductor 38(1) and doped semiconductor strip 38(2) are on the glass substrate. The undoped semiconductor 40(1) and the doped semiconductor 40(2) extend across a portion of the undoped semiconductor 38(1) and the doped semiconductor strip 38(2). The insulator 34 is on a portion of the doped semiconductor 38(1) and the TCO layer 30 is sandwiched between the insulator 34 and doped semiconductor 40(2).

Referring to FIGS. 10(e-f), the power distribution in the waveguide at $N=N_1$ and $N=N_2$, respectively, is shown. Simulation results demonstrate that the overall throughput is 88.2% at $N=N_1$, and 39.1% at $N=N_2$. Note that the insertion loss is only 0.55 dB (88.2%). The achievable modulation depth, 3.53 dB, is smaller than the one predicted by the three-dimensional mode solver. This is due to the mode mismatch between the slot waveguide of the modulator and its input/output rib waveguide. Performance (modulation depth and insertion loss) can be significantly improved by replacing the input/output rib waveguide with a dielectric slot waveguide.

In addition, the optical bandwidth of the modulators can be over several THz due to the slow Drude dispersion. The exemplary EA modulators 10(3) and 10(4) can potentially work at an ultra-high speed, being mainly limited by the RC delay imposed by electric circuits.

Accordingly, as illustrated by way of the examples illustrated and described herein light absorption can be greatly enhanced in one of the exemplary ENZ-slot waveguides 12(8) and 12(9). These exemplary EA modulators 10(3) and 10(4) also will remove the technical bottleneck in on-chip optical interconnects with advantages including nanoscale footprints, small insertion loss, potential ultrahigh speed, and easy fabrication.

In addition to EA modulators 10(3) and 10(4), ENZ-slot waveguides also have other applications. One example is the non-mechanical laser-beam-steering (LBS), which is a critical technique for applications, such as optical free space communications and Light Detection and Ranging (LIDAR) systems.

Figure 11A:
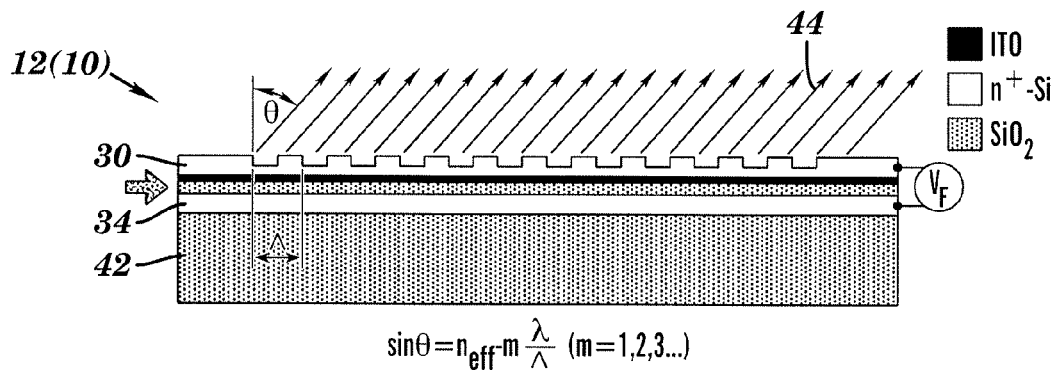
FIG. 11(a) is a side cross-sectional view of an exemplary waveguide used for non-mechanical laser beam steering.
Figure 11B:
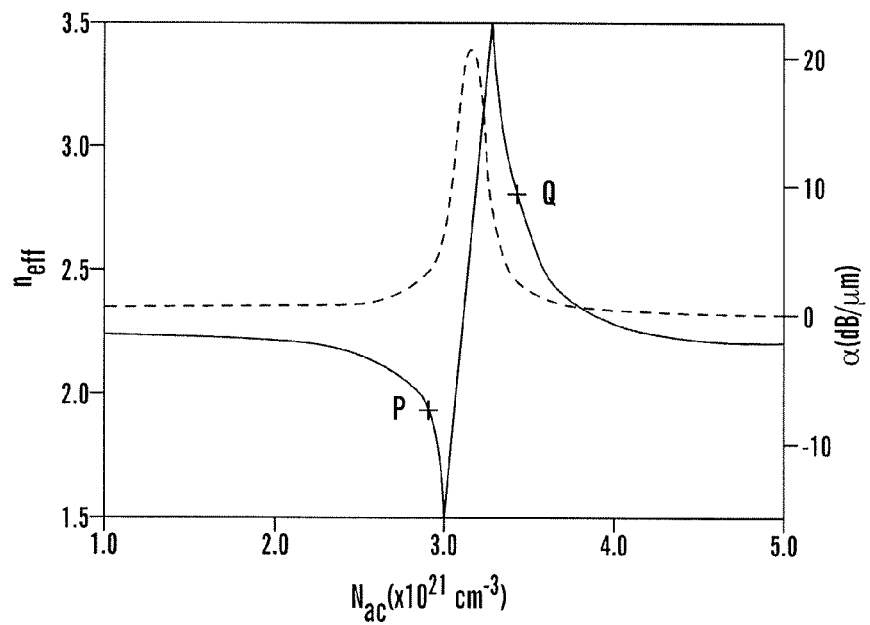
FIG. 11(b) is a diagram of the effective index and absorption of the waveguide as a function of accumulation layer carrier concentration.
Figure 11C:
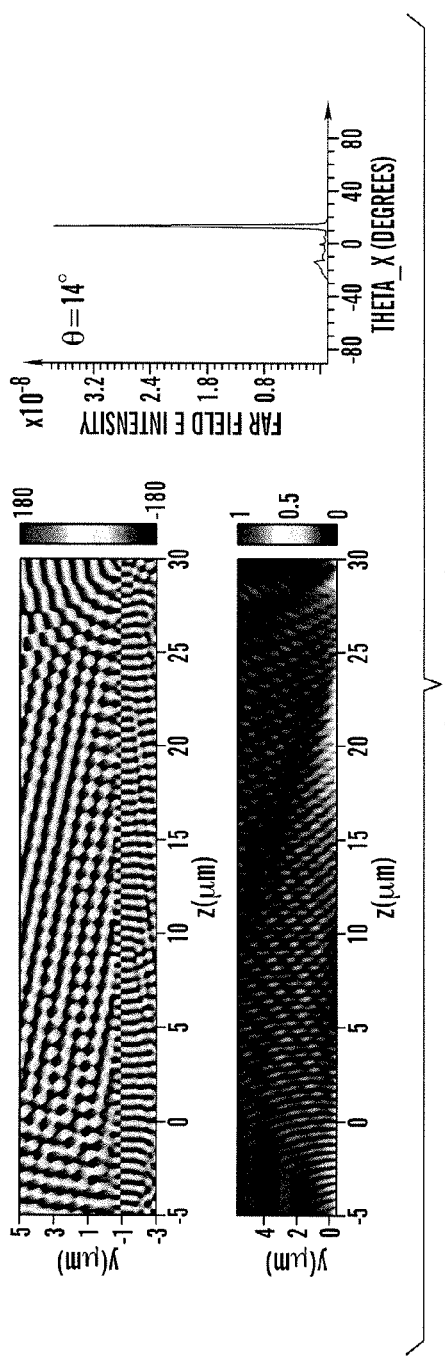
FIG. 11(c) is a graph of simulation of the beam steering at a radiation angle of fourteen degrees.
Figure 11D:
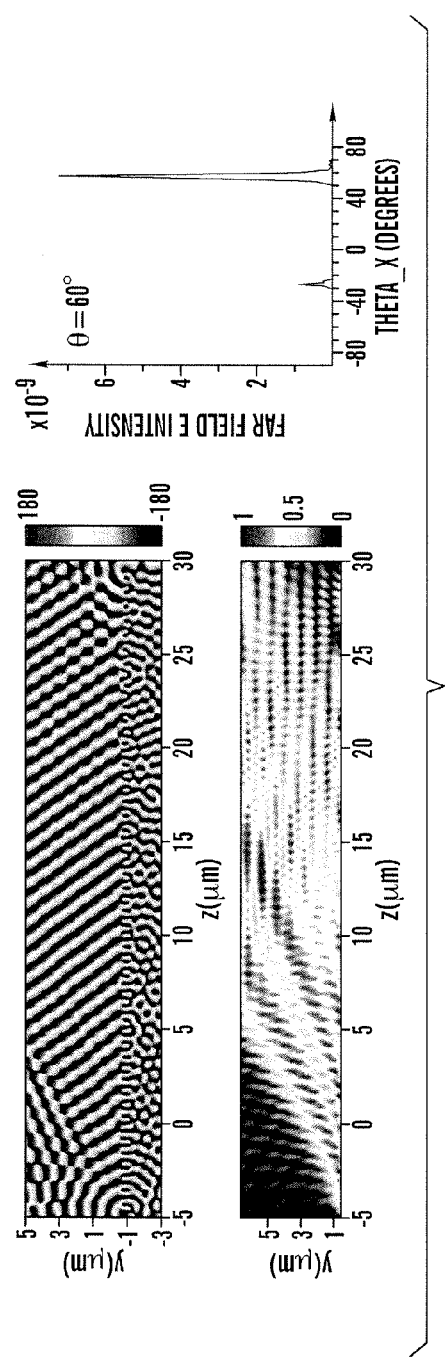
FIG. 11(d) is a graph of a simulation of beam steering at a radiation angle of sixty degrees.

With the tunable ENZ materials illustrated and discussed herein, large angle, waveguide-based, ultrafast LBS can be made. The propagation constant of the slot mode is also sensitive to the index of the slot at the vicinity of $\in=0$. Even though the index change only occurs in the ~5 nm accumulation layer, it can be used to tune the effective index ($n_{eff}$) of the whole waveguide from ~1.5 to ~3.5. The radiation angle θ is given by the grating equation:

$$\sin\theta = n_{eff} - m\frac{\lambda}{\Lambda} \quad (m = 1, 2, 3 \ldots) \tag{1}$$

where Λ is the pitch of the grating. A unitary change on $n_{eff}$ enables 90° steering in radiation angle. GHz large-angle LBS can be realized when a grating 44 is incorporated on a waveguide 12(10) as illustrated in FIG. 11(a). This exemplary waveguide 12(10) includes a dielectric substrate 42, an insulator 34, a TCO layer 30, and the grating layer 44, although other types of waveguides, other types and numbers of layers, elements or other components, made of other materials, and in other configurations could be used With this exemplary waveguide 12(10), there is a tradeoff with the loss as shown in FIG. 11(b). The Drude model for the accumulation layer was assumed and λ=1310 nm. For EA modulator applications, the OFF-state corresponds to the maximum absorption peak, which should be avoided in the LBS. Two working points, P and Q, are chosen as shown in FIG. 11(b) with $n_{eff}=1.9$ and 2.7. Their corresponding absorption is roughly a=1.2 dB/µm. As shown in FIGS. 11(c-d), these two working points result in 14° and 60° radiation angles, respectively. In the FDTD simulations, λ=1310 nm, Λ=715 nm, and groove depth is 20 nm. This LBS has a number of advantages including its ultracompact dimensions and GHz operation, which cannot be achieved in any conventional LBS technique.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. An electro-optical waveguide apparatus comprising:
   a graphene sheet having opposing surfaces sandwiched in a waveguide structure; and
   a tuning device configured to selectively control application of at least first and second gate voltages across the waveguide structure, the graphene sheet having a first dielectric constant which is zero and the waveguide structure operating at a first absorption state and a first propagation distance with application of the first gate voltage by the tuning device, and the graphene sheet having a second dielectric constant which is larger than the first dielectric constant and the waveguide structure operating at a second absorption state which is smaller than the first absorption state and a second propagation distance which is longer than the first propagation distance with application of the second gate voltage which is zero or smaller than the first gate voltage by the tuning device.

2. The apparatus of claim 1 wherein the waveguide structure comprises a dielectric waveguide structure having a dielectric material over each of the opposing surfaces of the graphene sheet.

3. The apparatus of claim 1 wherein the waveguide structure comprises a dielectric strip waveguide structure with the dielectric material over one of the opposing surfaces of the graphene sheet having a different width then the dielectric material over the other one of the opposing surfaces of the graphene sheet.

4. The apparatus of claim 1 wherein the waveguide structure comprises a metal waveguide structure having a different conductive material over each of the opposing surfaces of the graphene sheet.

5. The apparatus of claim 1 wherein the waveguide structure comprises a metal strip waveguide structure with a conductive material over one of the opposing surfaces of the graphene sheet having a different width then another conductive material over the other one of the opposing surfaces of the graphene sheet.

6. The apparatus of claim 1 wherein the waveguide structure comprises a plasmonic waveguide structure with a conductive material over one of the opposing surfaces of the graphene sheet having a dielectric material over the other one of the opposing surfaces of the graphene sheet.

7. The apparatus of claim 1 wherein the waveguide structure comprises a plasmonic waveguide structure with a conductive material over one of the opposing surfaces of the graphene sheet having a different width then a dielectric material over the other one of the opposing surfaces of the graphene sheet.

8. The apparatus of claim 1 wherein the graphene sheet comprises one of a mono-atomic layer, a bi-atomic layer, or a multi-atomic layer.

9. The apparatus of claim 1 further comprising one of an insulating layer or a semiconductor buffer layer on one of the opposing surfaces of the graphene sheet.

10. The apparatus of claim 9 further comprising one of another insulating layer or another semiconductor buffer layer on the other one of the opposing surfaces of the graphene sheet.

11. The apparatus of claim 1 wherein the electro-optical apparatus comprises one of an electro-optic modulator, an all-optic modulator, or a optical detector.

12. A method for making an electro-optical apparatus, the method comprising:
    providing a graphene sheet having opposing surfaces sandwiched in a waveguide structure; and
    providing a tuning device configured to selectively control application of at least first and second gate voltages across the waveguide structure, the graphene sheet having a first dielectric constant which is zero and the waveguide structure operating at a first absorption state and a first propagation distance with application of the first gate voltage by the tuning device, and the graphene sheet having a second dielectric constant which is larger than the first dielectric constant and the waveguide structure operating at a second absorption state which is smaller than the first absorption state and a second propagation distance which is longer than the first propagation distance with application of the second gate voltage which is zero or smaller than the first gate voltage by the tuning device.

13. The method of claim 12 wherein the waveguide structure comprises a dielectric waveguide structure having a dielectric material over each of the opposing surfaces of the graphene sheet.

14. The method of claim 12 wherein the waveguide structure comprises a dielectric strip waveguide structure with the dielectric material over one of the opposing surfaces of the graphene sheet having a different width then the dielectric material over the other one of the opposing surfaces of the graphene sheet.

15. The method of claim 12 wherein the waveguide structure comprises a metal waveguide structure having a different conductive material over each of the opposing surfaces of the graphene sheet.

16. The method of claim 12 wherein the waveguide structure comprises a metal strip waveguide structure with a conductive material over one of the opposing surfaces of the graphene sheet having a different width then another conductive material over the other one of the opposing surfaces of the graphene sheet.

17. The method of claim 12 wherein the waveguide structure comprises a plasmonic waveguide structure with a conductive material over one of the opposing surfaces of the graphene sheet having a dielectric material over the other one of the opposing surfaces of the graphene sheet.

18. The method of claim 12 wherein the waveguide structure comprises a plasmonic waveguide structure with a conductive material over one of the opposing surfaces of the graphene sheet having a different width then a dielectric material over the other one of the opposing surfaces of the graphene sheet.

19. The method of claim 12 wherein the graphene sheet comprises one of a mono-atomic layer, a bi-atomic layer, or a multi-atomic layer.

20. The method of claim 12 further comprising providing one of an insulating layer or a semiconductor buffer layer on one of the opposing surfaces of the graphene sheet.

21. The method of claim 20 further comprising providing one of another insulating layer or another semiconductor buffer layer on the other one of the opposing surfaces of the graphene sheet.

22. The method of claim 12 wherein the electro-optical apparatus comprises one of an electro-optic modulator, an all-optic modulator, or a optical detector.

23. An electro-optical waveguide apparatus comprising:
an epsilon-near-zero layer having opposing surfaces sandwiched in a waveguide structure; and
a tuning device configured to selectively control application of at least first and second gate voltages across the waveguide structure, the epsilon-near-zero layer having a first dielectric constant which is zero and the waveguide structure operating at a first absorption state and a first propagation distance with application of the first gate voltage by the tuning device, and the epsilon-near-zero layer having a second dielectric constant which is larger than the first dielectric constant and the waveguide structure operating at a second absorption state which is smaller than the first absorption state and a second propagation distance which is longer than the first propagation distance with application of the second gate voltage which is zero or smaller than the first gate voltage by the tuning device.

24. The apparatus as set forth in claim 23 wherein the epsilon-near-zero layer comprises a transparent conducting oxide.

25. The apparatus as set forth in claim 23 wherein the waveguide structure comprises a laser beam steering structure with the epsilon-near-zero layer sandwiched between at least a dielectric layer and a grating layer.

26. The apparatus as set forth in claim 25 wherein the laser beam steering structure further comprises at least one insulating layer between the dielectric layer and the epsilon-near-zero layer.

27. A method for making an electro-optical apparatus, the method comprising:
providing an epsilon-near-zero layer having an opposing surfaces sandwiched in a waveguide structure; and
providing a tuning device configured to selectively control application of at least first and second gate voltages across the waveguide structure, the epsilon-near-zero layer having a first dielectric constant which is zero and the waveguide structure operating at a first absorption state and a first propagation distance with application of the first gate voltage by the tuning device, and the epsilon-near-zero layer having a second dielectric constant which is larger than the first dielectric constant and the waveguide structure operating at a second absorption state which is smaller than the first absorption state and a second propagation distance which is longer than the first propagation distance with application of the second gate voltage which is zero or smaller than the first gate voltage by the tuning device.

28. The method as set forth in claim 27 wherein the epsilon-near-zero layer comprises a transparent conducting oxide.

29. The method as set forth in claim 27 wherein the waveguide structure comprises a laser beam steering structure with the epsilon-near-zero layer sandwiched between at least a dielectric layer and a grating layer.

30. The method as set forth in claim 29 wherein the laser beam steering structure further comprises at least one insulating layer between the dielectric layer and the epsilon-near-zero layer.

* * * * *